United States Patent [19]
Linder

[11] 3,935,539
[45] Jan. 27, 1976

[54] A-C SIGNAL MULTIPLYING CIRCUIT BY A RATIO OF WHOLE NUMBERS THE NUMERATOR OF WHICH IS GREATER THAN ONE AND GREATER THAN THE DENOMINATOR

[75] Inventor: John L. Linder, Las Cruces, N. Mex.

[73] Assignee: The United States of America as represented by the Secretary of the Navy, Washington, D.C.

[22] Filed: Oct. 21, 1974

[21] Appl. No.: 516,540

Related U.S. Application Data

[62] Division of Ser. No. 459,146, April 8, 1974, Pat. No. 3,882,303.

[52] U.S. Cl. .............. 328/38; 307/220 R; 328/160; 328/161
[51] Int. Cl.² ................ H03K 5/156; G06G 7/161
[58] Field of Search ...... 307/220, 225; 328/38, 158, 328/160, 161

[56] References Cited
UNITED STATES PATENTS

| | | |
|---|---|---|
| 3,673,391 | 6/1972 | Lougheed .................. 328/38 X |
| 3,753,125 | 8/1973 | Ishikawa et al. .................. 328/38 |
| 3,769,597 | 10/1973 | Mayer .................. 307/220 R X |
| 3,835,396 | 9/1974 | Demos et al. .................. 328/38 X |

*Primary Examiner*—Stanley D. Miller, Jr.
*Assistant Examiner*—L. N. Anagnos
*Attorney, Agent, or Firm*—Richard S. Sciascia; Joseph M. St.Amand; Darrell E. Hollis

[57] ABSTRACT

A digital frequency correlator circuit for comparing the frequencies of a plurality of a-c signals to determine if they are coherent within a predetermined number of cycles. The a-c signals are converted into digital numbers representing their frequencies. The digital numbers are subtracted and the difference is compared, utilizing an exclusive-or circuit, with a predetermined number of cycles. If the difference is greater than the predetermined number of cycles, a logic 0 is outputted. If the difference is equal to or less than the predetermined number of cycles, a logic 1 is outputted.

1 Claim, 3 Drawing Figures

A-C SIGNAL MULTIPLYING CIRCUIT BY A RATIO OF WHOLE NUMBERS THE NUMERATOR OF WHICH IS GREATER THAN ONE AND GREATER THAN THE DENOMINATOR

This is a division of application Ser. No. 459,146 filed Apr. 8, 1974, now U.S. Pat. No. 3,882,303.

BACKGROUND OF THE INVENTION

The present invention relates generally to frequency correlators and more particularly to such frequency correlators utilizing digital subtraction techniques.

In satellite tracking stations, sweep voltages to the receivers must be provided with the proper amplitude and duration to ensure that the receivers search in the correct doppler frequency range at the proper rate. The sweep voltages generated in a satellite tracking station are functions of the received doppler frequency signals. Thus, if the doppler, frequency signal is lost, the sweep voltage circuit must receive an indication of this so that it can hold a count of what the doppler frequency was when the signal was lost, so the sweep voltage will cause the receiver to start searching in the correct doppler frequency range. The present invention solves this critical problem by providing a logic 1 to the sweep voltage circuit when the received doppler frequency signals are coherent, i.e., within a predetermined frequency range, and a logic 0 when the received doppler frequency signals are incoherent, i.e., when the signal is lost.

SUMMARY OF THE INVENTION

The general purpose of the present invention is to provide an indication of whether the received doppler frequency signals in a satellite tracking station are coherent, thus enabling the receivers to correctly track. To attain this, a specific embodiment of the present invention converts the high and low frequency received doppler frequency signals into digital numbers representing the frequency of the high and low received doppler frequency signals. Each digital number is then subtracted from the other, resulting in a digital representation of the difference in cycles between the two. This digital representation of the difference in cycles is then compared with a predetermined number of cycles. If the digital representation is larger than the predetermined number of cycles, then a logic 0 is outputted, indicating a lack of coherency between the received signals. Otherwise, a logic 1 is outputted, indicating that the received signals are coherent.

Accordingly, one object of the present invention is to provide an indication of coherency or incoherency of received doppler frequency signals.

Another object of the present invention is to reduce cost.

Another object of the present invention is to reduce size.

Another object of the present invention is to reduce weight.

Another object of the present invention is to increase reliability of operation.

Another object of the present invention is to reduce susceptibility to repair and replacement.

Another object of the present invention is to compare a plurality of a-c signals to determine if they are coherent within a predetermined number of cycles or frequency range.

Another object of the present invention is to multiply an a-c signal by a ratio of whole numbers the numerator of which is greater than one and greater than the denominator.

Other objects and a more complete appreciation of the present invention and its many attendant advantages will develop as the same becomes better understood by reference to the following detailed description when considered in connection with the accompanying drawings wherein like reference numerals designate like parts throughout the figures thereof and wherein:

DETAILED DESCRIPTION OF THE PREFERRED EMBODIMENT

Figure 1:
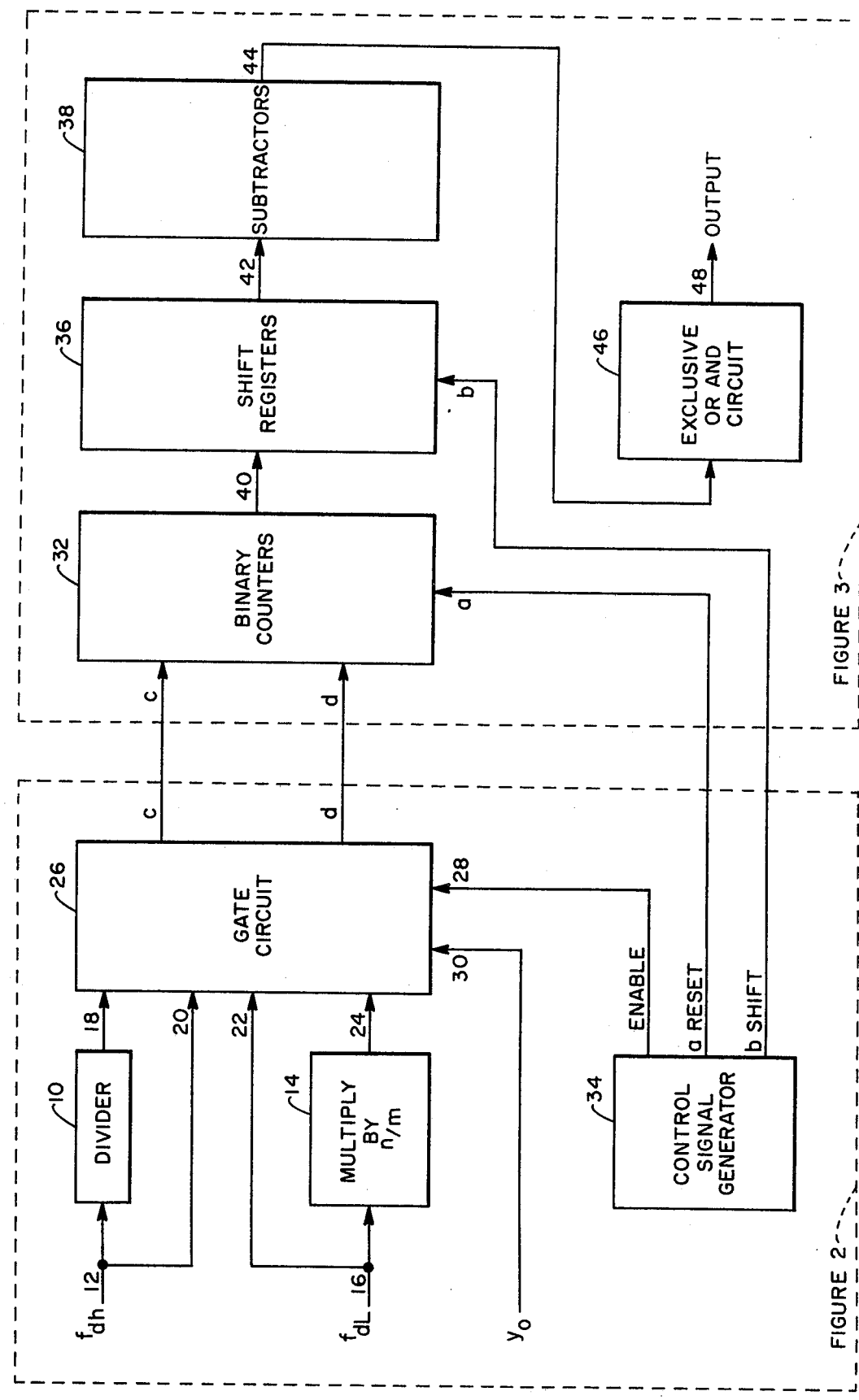
FIG. 1 is a block diagram of a specific embodiment of the digital frequency correlator illustrating interconnections.

Referring to FIG. 1, $f_{dh}$ and $f_{dl}$ are received doppler frequency signals inputting divider 10 on line 12 and multiply-by-$n/m$ 14 on line 16. $f_{dh}$ represents the high received doppler frequency signal and $f_{dl}$ represents the low received doppler frequency signal. Divider 10 divides the frequency of $f_{dh}$ and multiply-by-$n/m$ 14 multiplies the frequency of $f_{dl}$ by $n/m$. $n/m$ is a ratio of whole numbers of which $n$ is greater than one and greater than $m$.

Gate 26 has inputs on lines 18, 20, 22 and 24 from divider 10, $f_{dh}$, $f_{dl}$, and multiply-by-$n/m$, respectively. $Y_o$ inputs gate 26 on line 30. $Y_o$, when at a logic 1 level, allows the signals on lines 18 and 22 to be gated to counters 32 via lines $c$ and $d$. $Y_o$, when at a logic 0 level, allows the signals on lines 20 and 24 to be gated to counters 32 via lines $c$ and $d$. An enable signal inputs gate 26 on line 28 from control-signal-generator 34. The enable signal on line 28 inhibits or allows the gating of signals from gate 26 to counters 32 when at a logic 0 level or a logic 1 level, respectively.

Counters 32 count the frequency of the signals on lines $c$ and $d$. A reset signal inputs counters 32 on line $a$ from control-signal-generator 34.

Shift registers 36 are interconnected in parallel with counters 32 by line 40. A shift signal inputs shift registers 36 on line $b$ from control-signal-generator 34.

The signals on lines 28, $a$ and $b$, synchronize the digital frequency correlator of FIG. 1 as follows. The reset signal on line $a$ resets counters 32. Then the enable signal on line 28 changes to a logic 1 level enabling gate 26 to pair signals on lines $c$ and $d$ to counters 32. Then after one second, the enable signal on line 28 changes to a logic 0 state, inhibiting the passage of signals on lines $c$ and $d$ to counters 32. At the same time, the shift signal on line $b$ causes shift register 36 to shift the contents of counters 32 into it. Then counters 32 are reset starting the cycle over.

Subtractors 38 receive the outputs of shift registers 36 via line 42. Subtractors 38 subtract the digital numbers from shift register 36 and outputs this difference plus a carry bit on line 44 to an exclusive-or AND circuit 46.

Exclusive-or AND circuit 46 compares the difference on line 44 with a predetermined number of cycles. If the difference on line 44 is greater than the predetermined number of cycles, exclusive-or AND circuit 46 outputs a logic 0 on line 48. If the difference on line 44 is equal to or less than the predetermined number of cycles, exclusive-or AND circuit 46 outputs a logic 1 on line 48.

It is noted that lines 40, 42, and 44 are representations of signal flow only. As will be observed, infra, lines 40, 42 and 44 each constitute a plurality of physical connections over which a plurality of signals pass.

Figure 2:
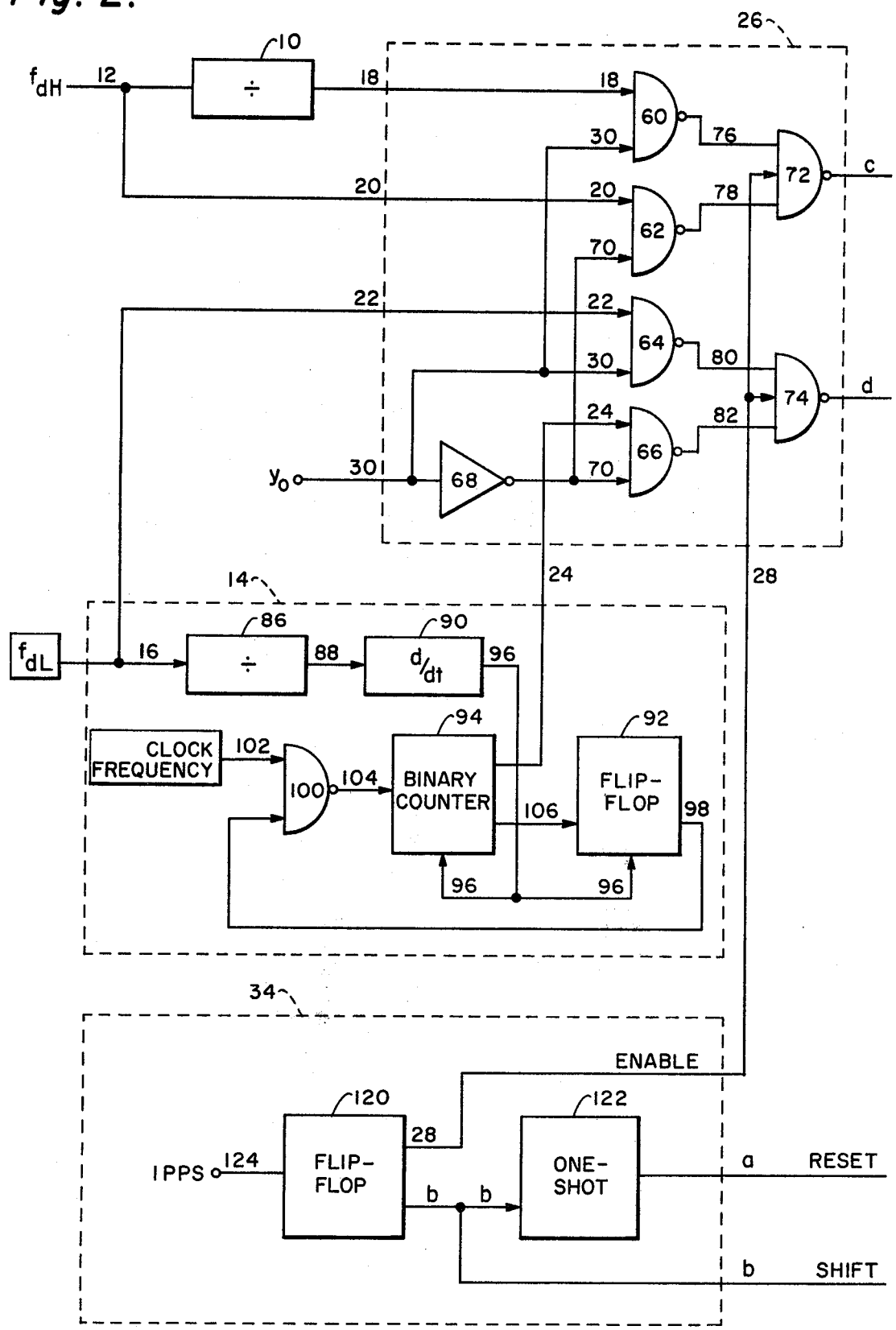
FIG. 2 is a partial detailed schematic diagram of the specific embodiment of FIG. 1.

Turning to FIG. 2, the a-c signals on lines 18, 20, 22 and 24 input individual gates 60, 62, 64 and 66, respectively, of gate circuit 26. Gate signal $Y_o$ inputs individual gates 60 and 64 on line 30. Inverter 68 inverts $Y_o$ and inputs individual gates 62 and 66 on line 70. Thus, when $Y_o$ is at a logic 1 level, individual gates 60 and 64 are enabled, and when $Y_o$ is at a logic 0 level, individual gates 62 and 66 are enabled.

Individual gates 60, 62, 64 and 66, inverter 68 and lines 30 and 70 constitute a means for receiving said gate signal and said plurality of second a-c signals, and outputting one of a plurality of predetermined sequences of said second a-c signals, depending on the voltage level of said gate signal. It is readily visualized by one skilled in the art that the above-described specific embodiment may contain many additional gates and input a-c signals as well as outputting many additional predetermined sequences of a-c signals. Four gates and two predetermined sequences were used for illustration purposes only.

Individual gate 72 is inputted by the a-c signals on lines 76 and 78 from gates 60 and 62, respectively, as well as by the enable signal on line 28 from control-signal-generator 34. Individual gate 74 is inputted by the a-c signals on lines 80 and 82 from gates 64 and 66, respectively, as well as by the enable signal on line 28 from control-signal-generator 34. When the enable signal on line 28 is at a logic 0 level, individual gates 72 and 74 are inhibited. When the enable signal on line 28 is at a logic 1 level, individual gates 72 and 74 are enabled, allowing the predetermined sequence of a-c signals on lines 76, 78, 80 and 82 to pass through and appear on lines c and d. Gates 72 and 74 and lines 76, 78, 80, 82 and 28 comprise a gate circuit. Again only two individual gates were utilized in the specific embodiment of FIG. 2 in order to simplify the illustration. Many additional individual gates can be utilized outputting many additional a-c signals to be converted to digital numbers and compared.

The a-c signal on line 24 is supplied by multiply-by-$n/m$ 14. $f_{dt}$ inputs divider 86 on line 16. Divider 86 divides the frequency of $f_{dt}$ by a whole number greater than one. The frequency divided signal on line 88 inputs differentiator 90. The output of differentiator 90 input flip-flop 92 and binary counter 94 via line 96. Flip-flop 92 outputs on line 98. Line 98 inputs clock-gate-circuit 100. Also, inputting clock-gate-circuit 100 is a clock frequency signal on line 102. Clock-gate-circuit 100 outputs on line 104, which inputs binary counter 94. Binary counter 94 outputs on line 24 and 106. Line 106 inputs flip-flop 92. Line 24 is the output of multiply-by-$n/m$ 14.

Multiply-by-$n/m$ 14 constitutes means for receiving and multiplying the frequency of said third a-c signal by a ratio of whole numbers wherein the absolute value of the numerator of said ratio is greater than the absolute value of the denominator of said ratio and greater than one. Differentiator 90, flip-flop 92, binary counter 94, clock-gate-circuit 100, and related interconnections and signals comprise a means for outputting a predetermined second whole number, greater than said first whole number, of cycles of said clock frequency for each cycle of said frequency-divided third a-c signal.

As a specific example of the operation of multiply-by-$n/m$ 14, let $n$ equal 8 and $m$ equal 3, $f_{dt}$ inputting divider 86 on line 16 is frequency-divided by 3 by divider 86 and outputted on line 88. The frequency-divided signal is differentiated by differentiator 90 which outputs a reset pulse to flip-flop 92 and binary counter 94 for each three cycles of $f_{dt}$. Resetting flip-flop 92 causes a logic 1 to appear on line 98, which enables clock-gate-circuit 100, allowing the clock frequency signal on line 102, which is approximately 200 KHz, to pass through clock-gate-circuit 100 to binary counter 94 via line 104. Binary counter 94 comprises four flip-flops (not shown) arranged in a four-bit binary counter configuration. Binary counter 94 counts each cycle of the clock frequency signal in line 104. After counting 16 cycles of the clock frequency signal on line 104, binary counter 94 outputs a signal on line 106 to flip-flop 92. The signal on line 106 resets flip-flop 92, causing a logic 0 to appear on line 98, thus inhibiting the clock frequency signal from passing through gate 100. At this time, eight full cycles have been outputted on line 24 from binary counter 94. Multiply-by-$n/m$ 14 then remains in this condition until the next reset pulse on line 96 from divider 86 and differentiator 90. Thus, for every three ($m$) cycles of $f_{dt}$, eight ($n$) cycles are outputted on line 24. An obvious requirement of this circuit is that the clock frequency signal on line 102 must always be greater than the frequency of $f_{dt}$.

Control signal generator 34 consists of flip-flop 120 and one-shot 122. A constant low frequency signal inputs flip-flop 120 on line 124. The constant low frequency signal in the specific embodiment of FIG. 2 is a one-pulse per second signal. The one-pulse per second enables binary counters 32 to output digital numbers directly representing cycles per second of the a-c signals on lines c and d. Flip-flop 120 outputs a logic 1 on line 28 which enables gates 72 and 74 for one second, then flip-flop 120 outputs a logic 0 on line 28 for 1 second, thereby inhibiting gates 72 and 74 for 1 second. Flip-flop 120 also outputs a logic 1 for 1 second and a logic 0 for 1 second on line b. Line b inputs one-shot 122. When the signal on line b changes from a logic 1 to a logic 0, one-shot 122 is triggered, outputting the reset pulse on line a. When the signal on line b changes from a logic 0 to a logic 1 level, the contents of binary counter 32 are shifted into shift registers 36.

Figure 3:
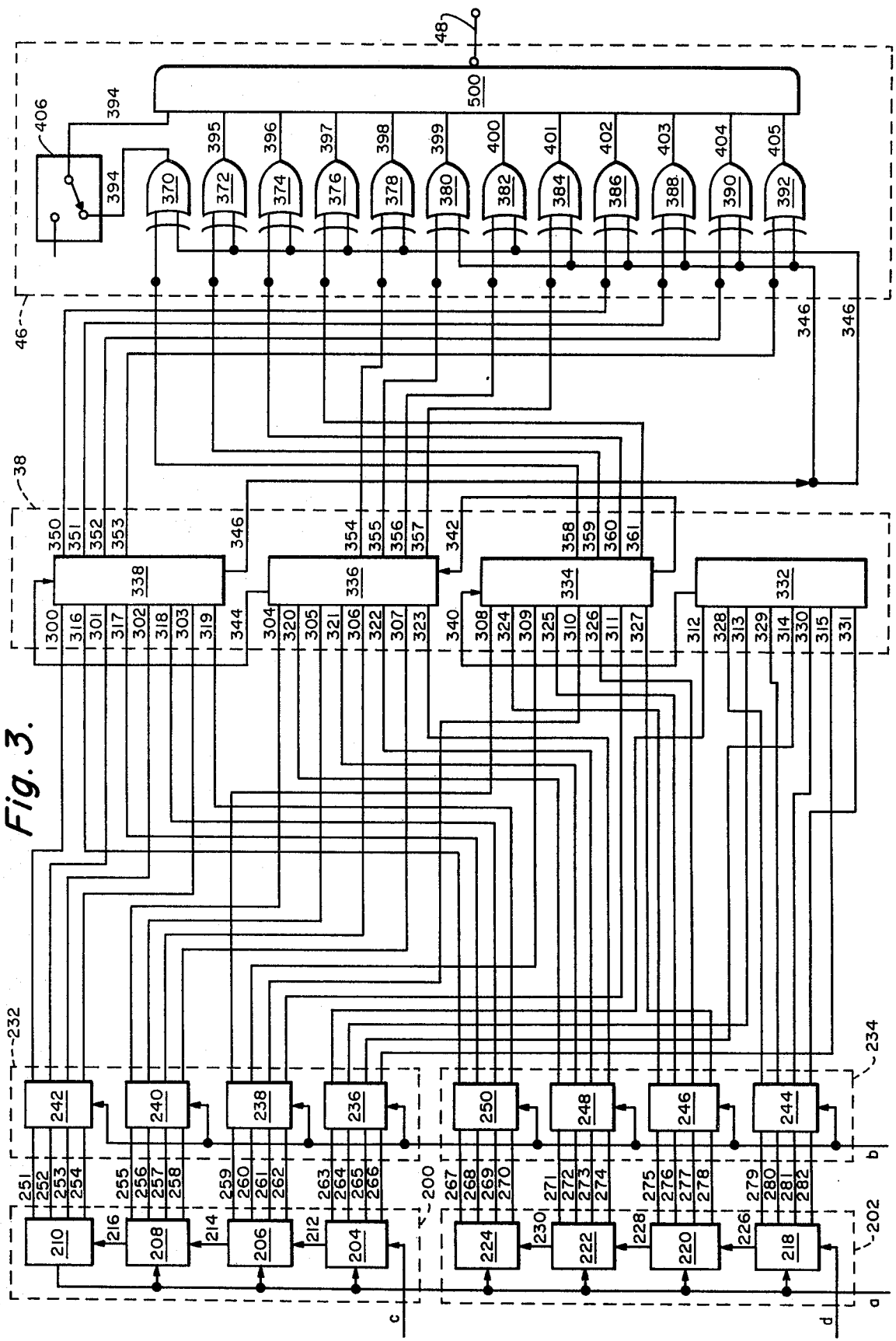
FIG. 3 is a partial detailed schematic diagram of the specific embodiment of FIG. 1.

Now turning to FIG. 3, the a-c signal on line c inputs counter circuit 200 and the a-c signal on line d inputs counter circuit 202. Counter circuit 200 contains individual counters 204, 206, 208 and 210 interconnected by lines 212, 214, and 216, respectively. Counter circuit 202 contains individual counters 218, 220, 222 and 224 interconnected by lines 226, 228, and 230, respectively. Also, inputting counters 200 and 202 and individual counters 204, 206, 208, 210, 218, 220, 222 and 224 is the reset signal on line a. Counters 200 and 202 count the frequency of the a-c signals on lines c and d, respectively. It is noted that there are only two counter circuits in the specific embodiment of FIG. 3, but there may be many more, depending on the number of a-c signals from gate circuit 26. There must be one counter circuit for each a-c signal from gate circuit 26. Also, only four individual counters are shown in each counter circuit of FIG. 3. However, additional individual counter circuits may be utilized, depending on the number of significant bits required.

Connected in parallel with counter circuits 200 and 202 are shift registers 232 and 234, respectively. Shift register 232 consists of individual shift registers 236, 238, 240 and 242. Shift register 234 consists of individual shift registers 244, 246, 248, and 250. It is noted that counter circuits 200 and 202 are binary counters, each of which output a sixteen-bit digital number representing the frequency of the a-c signals on line $c$ and $d$, respectively. These sixteen-bit numbers are shifted into shift registers 232 and 234 from counters 200 and 202 via lines 251–282. Also, inputting shift registers 232 and 234 is the shift signal on line $b$. Counter circuits 200 and 202 comprise binary counters 32 of FIG. 1. Shift registers 232 and 234 comprise shift registers 36 of FIG. 1. Also, lines 251–282 comprise line 40 of FIG. 1. In addition, it is noted that there must be one shift register for each a-c signal compared. Binary counter 32 and shift registers 36 of FIG. 1 comprise a means for receiving said plurality of first a-c signals and converting each of said first a-c signals into a digital number representing the frequency of each first a-c signal.

Shift register 232 outputs its binary number on lines 300–315. Shift register 234 outputs its binary number on lines 316–331. Lines 300–331 comprise line 42 of FIG. 1.

Subtractor 38 comprises four-bit binary full adders 332, 334, 336 and 338. Adders 332, 334, 336 and 338 are wired to perform the function of adding two 16-bit binary numbers from storage registers 232 and 234. Adder 332 is connected to adder 334 via line 340. Adder 334 is connected to adder 336 via line 342. Adder 336 is connected to adder 338 via line 344. The carry-bit is outputted by adder 338 on line 346.

Theoretically, the subtraction process is performed by complementing one of the numbers, adding it to the second number and complementing the answer, if there is no carry; or not complementing the answer, if there is a carry. If there is no carry, the answer is the complement directly. If there is a carry, the carry must be added to the sum to obtain the answer. The output of shift register 232 is the complement output, i.e., the output is the complement of the digital number representing the frequency of the a-c signal on line $c$.

Note that the inputs on line 315 and 331 to adder 332 at the two least significant bits of the two digital numbers. The inputs on lines 314 and 330 to adder 332 are the next two least significant bits of the two digital numbers. This sequence continues through adders 334, 336, and 338 to the most significant bits of the two digital numbers inputting adder 338 on lines 300 and 316.

The outputs of subtractors 38 are on lines 350–361. There are no outputs from adder 332 because 16 is the predetermined number of cycles the two digital numbers are permitted to differ by in the specific embodiment of FIG. 3. The lines 350–361 represent a digital representation of the difference in frequency of the a-c signals on lines $c$ and $d$. Line 358 carries the bit weighted 32. Line 359 carries the bit weighted 64. Line 360 carries the bit weighted 128. Line 361 carries the bit weighted 256, and so on through adders 336 and 338.

Exclusive-or AND circuit 46 is comprised of exclusive-or gates 370, 372, 374, 376, 378, 380, 382, 384, 386, 388, 390, 392 and 12-leg AND gate 500. Gate 370 is inputted by lines 358 and 346. Gate 372 is inputted by lines 359 and 346. Gate 374 is inputted by lines 360 and 346. Gate 376 is inputted by lines 361 and 346. Gate 378 is inputted by lines 354 and 346. Gate 380 is inputted by lines 355 and 346. Gate 382 is inputted by lines 356 and 346. Gate 384 is inputted by lines 357 and 346. Gate 386 is inputted by lines 350 and 346. Gate 388 is inputted by lines 351 and 346. Gate 390 is inputted by lines 352 and 346. Gate 392 is inputted by lines 353 and 346. Lines 394–405 connect exclusive-or gates 370, 372, 374, 376, 378, 380, 382, 384, 386, 388, 390 and 392, respectively, to 12-legs AND gate 500. Line 48 is the output of AND gate 500 and the digital frequency correlator. Switch 406 switches in or out the 32 weighted bit from adder 334, illustrating one method of how the predetermined number of cycles that the a-c signals on lines $c$ and $d$ can differ by can be varied. Switch 406 interrupts line 394 between exclusive-or gate 370 and AND gate 500. Line 350–361 represent line 44 of FIG. 1.

As an example of how the circuit of FIG. 3 operates, assume that the a-c signal on line $c$ is 21354 Hz and the a-c signal on line $d$ is 21337 Hz. The output of shift register 232 would be 1010110010010101 and the output of shift register 234 would be 0101001101011001. The output of subtractor 38 would be 1111111111101110 with a 0 carry. Note the complement of 1111111111101110 is 17 or 0000000000010001. The four least significant bits are not inputted to exclusive-or 46. Thus, the digital number 111111111110 would input exclusive-or circuit 46. Each bit would be compared with the carry bit 0 and the output of exclusive-or gates 370–392 is 111111111110. Thus, the input to AND gate 500 on lines 394–405 would be 111111111110 which would result in a logic 0 output on line 48, indicating that the difference in the a-c signals was greater than the predetermined number of cycles permissible.

It is noted that, if there are more than two a-c signals to be compared, additional subtractors 44 and exclusive-or circuits 46 must be employed. Also, with more than two a-c signals, comparisons between all or some of the signals may be outputted. Each exclusive-or circuit must receive one digital representation of the difference in cycles between two a-c signals and the carry therefrom. Associated with each exclusive-or circuit must be at least one AND gate. Assuming there are four a-c signals, six subtractors 38 and six exclusive-or circuits 46 will be utilized. Six are used because each a-c signal must be compared with each other a-c signal. In addition, from one to five additional AND gates must be utilized, depending on the flexibility of the circuit desired.

$f_{dh}$, divider 10, $f_{dl}$ and multiply-by-$n/m$ 14 comprise a means for providing a plurality of second a-c signals. $f_{dh}$, divider 10, $f_{dl}$, multiply-by-$n/m$ 14 and gate circuit 26 comprise a means for providing a plurality of first a-c signals. Gates 60, 62, 64 and 66, $Y_o$ and inverter 68 comprise a means for outputting one of a plurality of predetermined sequences of said second a-c signals.

It will be appreciated by those having ordinary skill in the art that the circuit diagrams of FIGS. 2 and 3 include the necessary biasing circuits and buffer amplifiers as are usually provided in such circuits. Such biasing and buffer amplifiers are not shown in FIGS. 2 and 3.

Obviously, many modifications and variations of the present invention are possible in light of the above teachings. It is therefore to be understood that within the scope of the appended claims the invention may be practiced otherwise than as specifically described.

I claim:

1. A frequency multiplier circuit for frequency-multiplying an a-c signal by a ratio of whole numbers wherein the absolute value of the numerator of said ratio is greater than the absolute value of the denominator of said ratio and greater than one comprising:
   a. means for providing an a-c signal;
   b. means for providing a clock-frequency-signal of frequency greater than said a-c signal, said clock-frequency-signal providing means having an output;
   c. means for receiving and dividing the frequency of said a-c signal by a first predetermined whole number greater than one said receiving and dividing means having an output;
   d. a differentiator circuit having an input and an output, said input being connected to said output of said means for receiving and dividing the frequency of said a-c signal by a first whole number greater than one;
   e. a clock gate curcuit having a clock-frequency-signal input, a second input and an output, said clock-frequency-signal input being connected to said output of said means for providing a clock-frequency-signal;
   f. a binary counter circuit having a first input, a second input, a first output, and a second output, said second input being connected to said output of said differentiator circuit, said first input being connected to said output of said clock gate circuit; and
   g. a flip-flop circuit having a first input, a second input, and an output, said first input being connected to said second output of said binary counter circuit, said second input being connected to said output of said differentiator circuit, said output of said flip-flop circuit being connected to said second input of said clock gate circuit, the signal on the output of said differentiator circuit resets said binary counter circuit and said flip-flop circuit, then said flip-flop circuit enables said clock gate circuit passing said clock frequency signal to said binary counter circuit, after counting a predetermined second whole number of cycles of said clock frequency signal, said second whole number being greater than one and greater than said first whole number, said binary counter circuit clocks said flip-flop circuit, causing said flip-flop circuit to inhibit said clock gate circuit until said differentiator circuit resets said binary counter circuit and said flip-flop circuit, whereby for every cycle of said frequency-divided a-c signal, said second whole number of cycles of said clock-frequency-signal appears on said binary counter circuit first output, said second whole number of cycles of said clock-frequency-signal appearing on said binary counter circuit first output being said ratio-of-whole-numbers, frequency multiplied, a-c signal.

* * * * *